(12) United States Patent
Keyser et al.

(10) Patent No.: US 6,231,038 B1
(45) Date of Patent: May 15, 2001

(54) TWO-PIECE CLAMP RING FOR HOLDING SEMICONDUCTOR WAFER OR OTHER WORKPIECE

(75) Inventors: William Keyser, Bulverde, TX (US); Kenneth Murphy, Barto; Timothy Edwards, Harleysville, both of PA (US)

(73) Assignee: Greene Tweed of Delaware, Inc., Wilmington, DE (US)

( * ) Notice: Subject to any disclaimer, the term of this patent is extended or adjusted under 35 U.S.C. 154(b) by 0 days.

(21) Appl. No.: 09/447,771

(22) Filed: Nov. 23, 1999

Related U.S. Application Data

(60) Provisional application No. 60/110,389, filed on Dec. 1, 1998.

(51) Int. Cl.$^7$ .................................................. B25B 1/20
(52) U.S. Cl. ........................ 269/287; 269/903; 269/100
(58) Field of Search ................................ 118/500, 503, 118/505, 729, 725, 728; 204/298.15; 156/345; 269/287, 903, 100

(56) References Cited

U.S. PATENT DOCUMENTS

| | | | |
|---|---|---|---|
| 5,280,894 | * | 1/1994 | Witcraft et al. ................... 269/287 |
| 5,513,594 | * | 5/1996 | McClanahan et al. ............... 269/287 |
| 5,578,167 | * | 11/1996 | Kathirgamasundaram .......... 156/345 |
| 5,632,873 | * | 5/1997 | Stevens et al. ....................... 118/603 |
| 5,810,931 | * | 9/1998 | Stevens et al. ....................... 156/345 |
| 5,958,198 | * | 9/1999 | Banholzer et al. ................... 156/345 |
| 6,123,804 | * | 9/2000 | Babassi et al. ....................... 156/345 |

\* cited by examiner

Primary Examiner—Robert C. Watson
(74) Attorney, Agent, or Firm—Akin, Gump, Strauss, Hauer & Feld, L.L.P.

(57) ABSTRACT

A clamp ring assembly for securing a generally circular workpiece to a supporting surface comprises an annular base ring having a radial inner surface of a predetermined diameter and at least one locking member. The base ring further includes at least one opening extending axially therethrough for securing the base ring to the supporting surface. An annular securing ring having a radial outer surface and a radial inner surface is provided. The diameter of the outer surface of the securing ring is the same as or slightly smaller than the diameter of the inner surface of the base ring and the securing ring includes at least one locking member for engaging the locking member of the base ring when the securing ring is assembled with the base ring. The securing ring also includes at least one workpiece engaging member for engaging and holding the workpiece against the supporting surface.

18 Claims, 4 Drawing Sheets

TWO-PIECE CLAMP RING FOR HOLDING SEMICONDUCTOR WAFER OR OTHER WORKPIECE

CROSS-REFERENCE TO RELATED APPLICATIONS

This non-provisional application claims the benefit of U.S. Provisional Patent Application No. 60/110,389, filed Dec. 1, 1998 and entitled, "Two-Piece Clamp Ring" which is incorporated herein by reference.

BACKGROUND OF THE INVENTION

The present invention relates generally to clamping or clamp rings and, more particularly, to a two-piece clamp ring assembly which is particularly well suited for holding a workpiece, such as a semiconductor wafer, firmly in place against a supporting surface particularly, during the performance of processing steps.

One-piece clamp rings are used extensively within semiconductor wafer processing chambers and elsewhere for the purpose of holding a round semiconductor wafer or other such workpiece in place on a supporting surface during the performance of various processing steps. Such one-piece clamp rings generally comprise a single generally annular structure having a series of engaging lugs on the inner circumferential portion and a series of circumferentially spaced openings extending therethrough proximate the outer circumference. Typically, eight to twelve such spaced openings are employed in the one-piece clamp ring and each such opening is adapted to receive a screw, bolt or other fastener for securing the one-piece clamp ring and thus, the semiconductor wafer or other workpiece to a supporting surface with the workpiece being held in place by the lugs.

While such one-piece clamp rings are highly effective in performing the requisite holding function, such one-piece clamp rings, particularly the portion proximate to the inner circumferential surface and the lugs which engage the semiconductor wafer or other workpiece tend to erode over time due to exposure to the materials employed in performing the various semiconductor wafer processing steps. When a one-piece clamp ring has so eroded to the point where it is no longer able to provide the proper clamping force to hold the semiconductor wafers in place, it becomes necessary to replace the entire clamp ring, which involves removing all of the securing fasteners and then installing a new clamp ring which then requires torquing all of the securing fasteners, a time consuming task which increases the semiconductor wafer processing time. The replaced one-piece clamp ring is then discarded, resulting in the loss of a substantial amount of the specialized material used in forming the one piece clamp ring.

The present invention comprises a two-piece clamp ring, including a radial outer ring section or base ring which is normally secured directly to the supporting surface and a removable, radial inner ring section or securing ring which is employed for engaging and holding the semiconductor wafer or other workpiece when removably secured or assembled to the base ring. In this manner, as the securing ring, through normal use, is eroded, the securing ring, by itself, can be quickly removed and replaced without the need for replacing the entire two ring assembly, thereby saving cost and time and more effectively utilizing the specialized material used to form the rings.

BRIEF SUMMARY OF THE INVENTION

Briefly stated, the present invention comprises a clamp ring assembly for securing a generally circular workpiece to a supporting surface. The clamp ring assembly comprises an annular base ring having a radial inner surface of a predetermined diameter and at least one locking member. The base ring further includes at least one opening extending axially therethrough for securing the base ring to the supporting surface. The clamp ring assembly further comprises an annular securing ring having a radial outer surface and a radial inner surface. The diameter of the outer surface of the securing ring is the same as, or slightly smaller than the diameter of the inner surface of the base ring. The securing ring includes at least one locking member for engaging the locking member of the base ring when the securing ring is assembled with the base ring. The securing ring further includes at least one workpiece engaging member for engaging and holding the workpiece against the supporting surface.

In another embodiment, the present invention comprises a clamp ring assembly for securing a generally circular semiconductor wafer to a supporting surface. The clamp ring assembly comprises an annular base ring having a radial inner surface of a predetermined diameter with the inner surface including a plurality of generally arcuate, radially inwardly extending circumferentially spaced locking members. The base ring further includes a plurality of circumferentially spaced openings extending axially therethrough for receiving fasteners for securing the base ring to the supporting surface. The clamp ring assembly further comprises an annular securing ring having a radial outer surface and a radial inner surface. The diameter of the outer surface of the securing ring is the same as, or slightly smaller than the diameter of the inner surface of the base ring. The outer surface of the securing ring includes a plurality of generally arcuate radially inwardly extending grooves so that when the securing ring is assembled with the base ring, each of the locking members is located within one of the grooves. The securing ring further includes a plurality of generally circumferentially spaced engaging members extending radially inwardly from the inner surface for engaging and holding the semiconductor wafer against the supporting surface.

BRIEF DESCRIPTION OF THE SEVERAL VIEWS OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
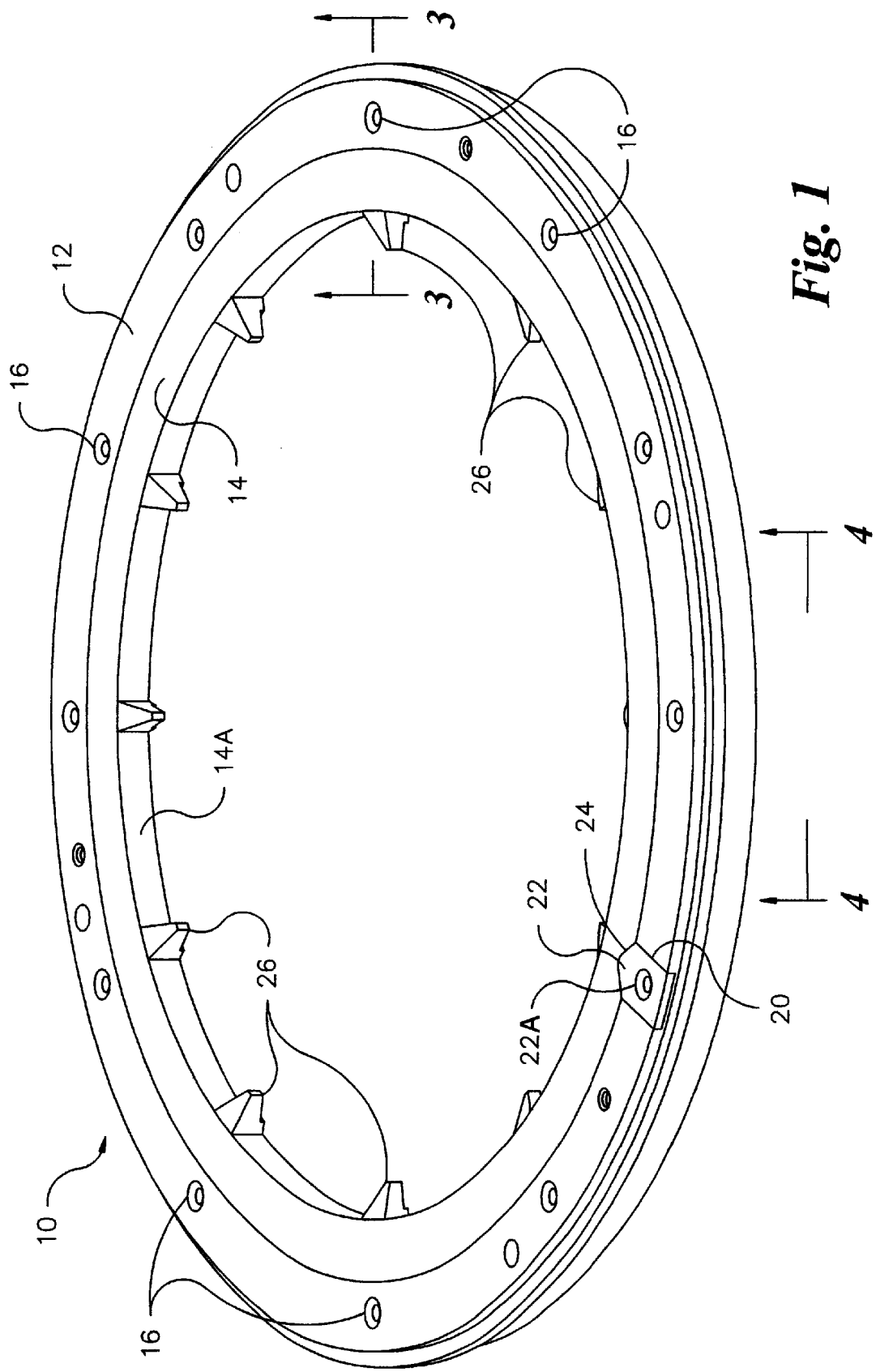
FIG. 1 is a perspective view, from above, of a fully assembled two-piece clamp ring assembly in accordance with a preferred embodiment of the present invention.
Figure 2:
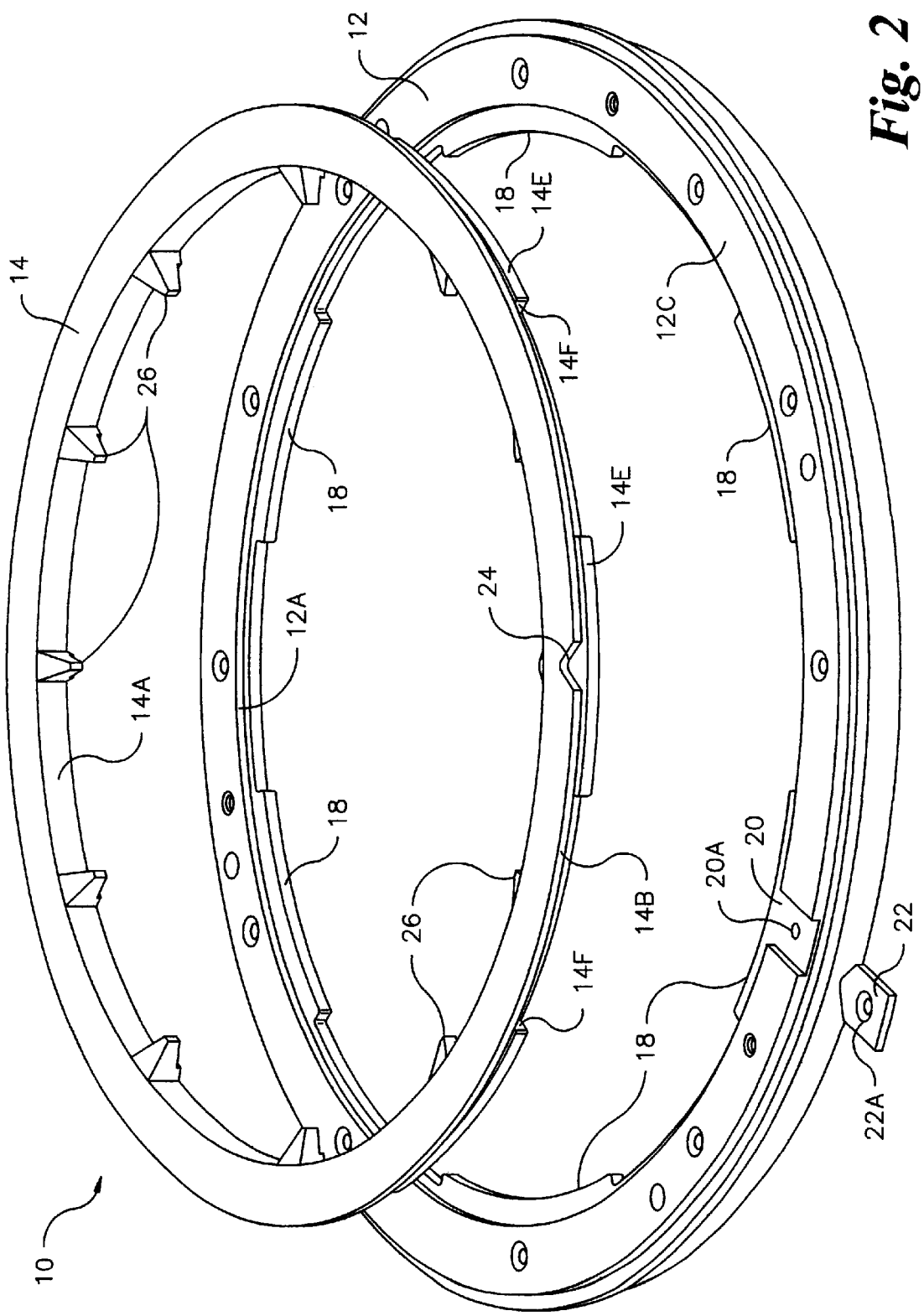
FIG. 2 is an exploded perspective view, from above, of the unassembled two-piece clamp ring assembly of FIG. 1.
Figure 3A:
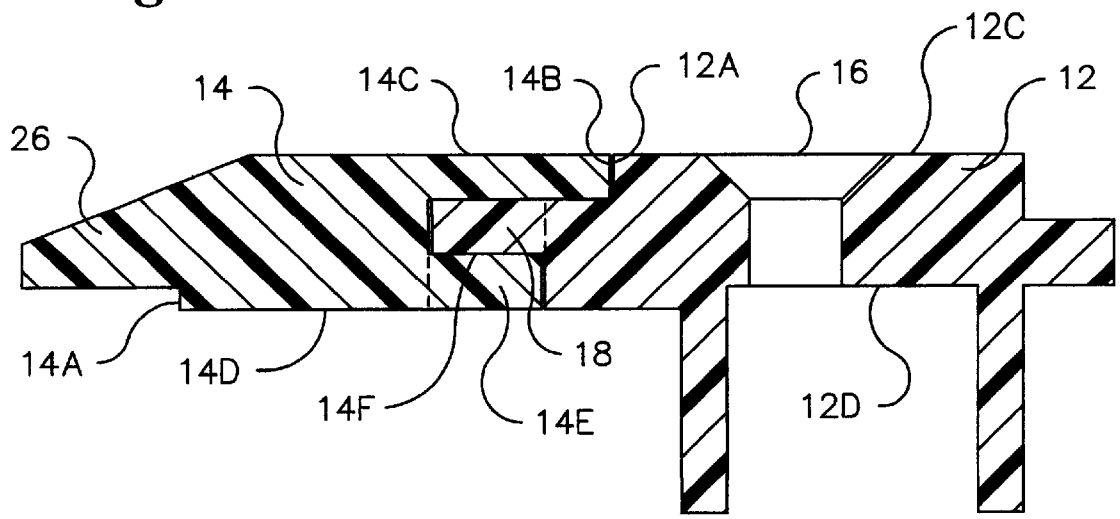
FIG. 3a is a sectional view of the two-piece clamp ring assembly taken along line 3—3 on FIG. 1.
Figure 3B:
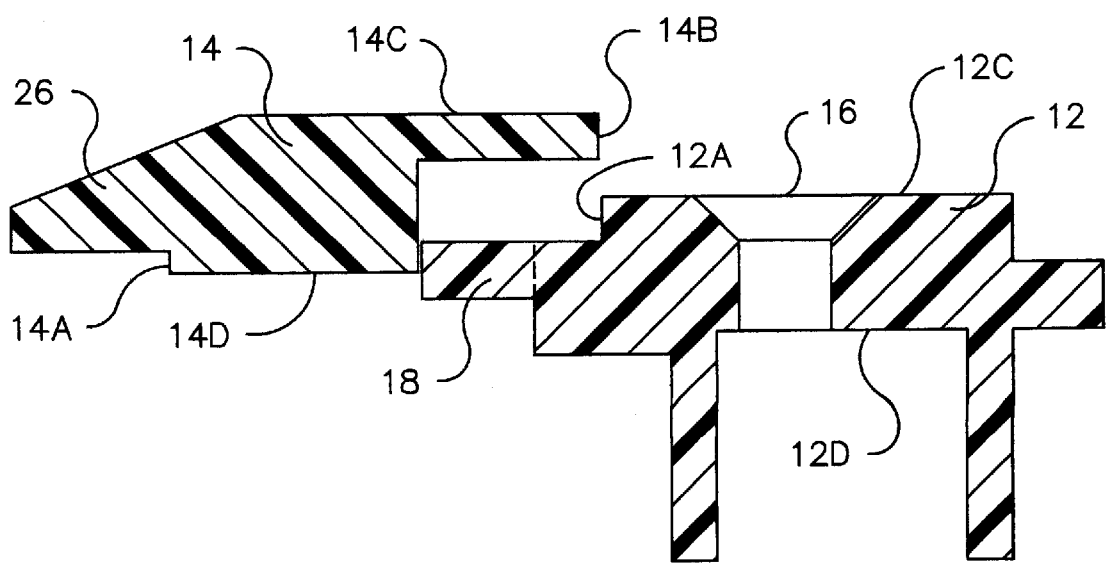
FIG. 3b is a sectional view of the two piece-clamp ring assembly similar to FIG. 3a during partial assembly.
Figure 4A:
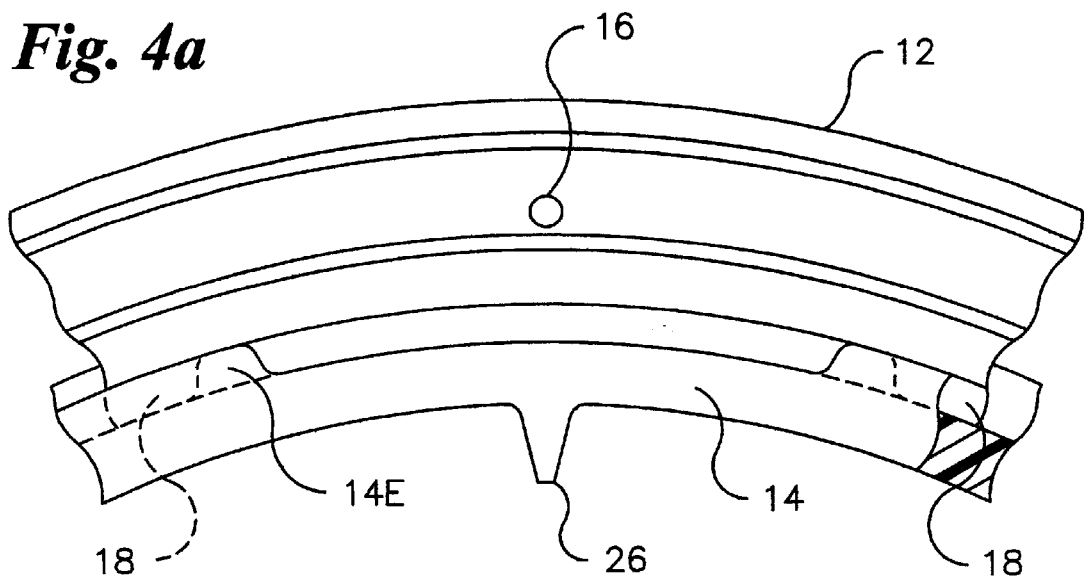
FIG. 4a is an enlarged fragmentary view of a portion of the assembled two-piece clamp ring assembly taken along line 4—4 of FIG. 1.
Figure 4B:
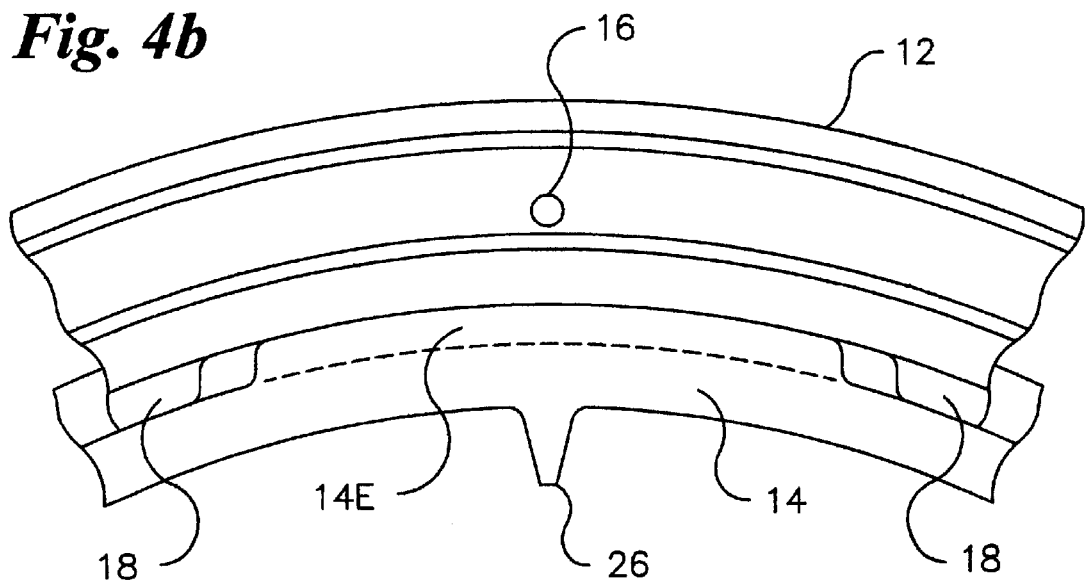
FIG. 4b is a view similar to FIG. 4a during partial assembly.

Referring to the drawings, wherein like numerals are used to indicate like elements throughout the several figures, there is shown in FIGS. 1–2 a preferred embodiment of a two-piece clamp ring assembly 10 for securing a semiconductor wafer or other generally circular workpiece (not shown) to an underlying supporting surface (not shown) in accordance with the present invention. In the present embodiment, the two-piece clamp ring assembly 10 is comprised of a first generally annular, radially outer ring or base ring 12 and a second, generally annular, radially inner ring or securing ring 14. The base ring 12 is generally irregularly shaped in cross section as shown in FIGS. 3a and 3b includes a generally continuous generally circumferential radial inner surface 12A of a first predetermined diameter. The securing ring 14 is also generally irregularly shaped and includes a generally circumferentially extending radial inner surface 14A and a generally circumferentially extending radial outer surface 14B, which has a second predetermined diameter. Preferably, the second predetermined diameter, the diameter of the radial outer surface 14B of the securing ring 14 is generally the same as or slightly smaller than, the first predetermined diameter, the diameter of the radial inner surface 12A of the base ring, so that the securing ring 14 and the base ring 12 may be assembled together in the manner which will hereinafter be described to form the clamp ring assembly 10 as shown in FIG. 1. Forming the base ring 12 and the securing ring 14 in this manner permits quick and convenient assembly and disassembly of the securing ring 14 to the base ring 12 for reasons which will hereinafter become apparent.

The base ring 12, although irregularly shaped in cross-section, includes an upper surface 12C and an under surface, or lower surface 12D, which includes two outwardly extending annular flanges. The lower surface 12D in combination with the annular flanges firmly engages an underline supporting surface (not shown) when the clamp ring assembly 10 is employed for securing a semiconductor wafer or other workpiece to such a supporting surface. At least one generally circular opening and preferably a plurality of such openings 16 extend through the base ring 12 from the upper surface 12C to the lower surface 12D. Preferably, there are twelve such openings 16 which are generally equally circumferentially spaced around the base ring 12 as best shown in FIG. 1. Preferably, each of the openings 16 includes a suitable countersink on the upper surface 12C of the base ring 12. Each of the openings 16 is adapted to receive a screw, bolt or other such elongated fastener (not shown) for the purpose of securing the base ring 12 to an underlying supporting surface (not shown) in a manner which will be appreciated by those of ordinary skill in the art. Preferably, the head end of each such fastener is suitably sized and shaped to fit within the countersink of the applicable opening 16, so that when the base ring 12 is secured to the underlying supporting surface, the fasteners and the upper surface 12C of the base ring provide a generally continuous, smooth appearance. It will be appreciated by those of ordinary skill in the art that a greater number or lesser number of openings 16 may be provided in the base ring 12. It will also be appreciated by those of ordinary skill in the art that the size, location and spacing of the openings 16 may vary from what is shown and described. Further, it will be appreciated by those of ordinary skill in the art that while in the present embodiment, the openings 16 are provided for receiving fasteners for securing the base ring 12 to an underlying supporting surface, some other type of structure, such as a removable clamp, a latch mechanism, a clip, an adhesive, or the like may alternatively be employed for securing the base ring 12 to the underlying supporting surface. Hence, the present invention is not limited to the use of fasteners extending through openings 16 as employed in connection with the present embodiment.

The base ring 12 further includes at least one locking member and preferably, a plurality of locking members 18 each of which preferably extends generally radially inwardly a predetermined distance from the radial inner surface 12A of the base ring 12. As best shown in FIGS. 2, 3a and 3b, in the present embodiment, the base ring 12 includes six generally identical locking members 18, with each locking member 18 being generally arcuate and of a predetermined arcuate length and with each locking member being spaced from the adjacent locking member by a predetermined arcuate distance. As best shown in FIGS. 3a and 3b, each of the locking members 18 also has a predetermined radial width and a predetermined axial thickness, which is less than the overall axial thickness of the base ring 12. For reasons which will hereinafter become apparent, the arcuate length of each of the locking members 18 is less than the arcuate length of the spacing between adjacent locking members 18. It will be appreciated by those of ordinary skill in the art that, if desired, a greater or lesser number of locking members 18 could be provided on the base ring 12 and that the arcuate length, spacing, radial width and/or axial thickness of the locking members 18 could vary from what is shown and described. The purpose of the locking members 18 is to facilitate the assembly and locking together of the base ring 12 and the securing ring 14 in a manner which will hereinafter be described. It should be understood by those of ordinary skill in the art that some other type of structural arrangement may be employed for attaching together the base ring 12 and the securing ring 14. Thus, the present invention is not limited to the particular locking members 18, as shown and described.

It will be appreciated by those of ordinary skill in the art that the size of the base ring 12 could vary depending upon the particular application and that the overall structure of the base ring could vary from that described above and shown in the drawings. For example, the base ring 12 could be thicker, could be more elongated or the like.

As best shown in FIGS. 2, 3a and 3b, the securing ring 14, although irregularly shaped, includes an upper surface 14C and an under surface or lower surface 14D. As best shown in FIGS. 1 and 3a, when the securing ring 14 is assembled to the base ring 12, the upper surface 14C of the securing ring is in substantially the same plane as the upper surface 12C of the base ring 12 to provide a smooth, generally continuous appearance. As previously mentioned, the radial outer surface 14B of the securing ring 14 is generally of the same diameter or of a slightly smaller diameter than inner radial surface 12A of the base ring 12, so that when the securing ring 14 is assembled to the base ring 12 as shown in FIGS. 1 and 3a, the radial spacing between the two rings 12, 14 is minimal, again, to provide a generally continuous smooth appearance.

As best shown in FIGS. 2 and 3a, the radial outer surface 14B of the securing ring 14 includes at least one locking member and preferably, a plurality of locking members which are adapted to cooperate with the locking members 18 on the radial inner surface 12A of the base ring 12 for assembling the securing ring 14 to the base ring 12. In the presently preferred embodiment as illustrated, the securing ring locking members comprise a plurality of generally arcuate grooves 14F which extend radially inwardly from the outer surface 14B of the securing ring 14. More particularly, each of the arcuate grooves 14F is formed by a generally arcuate flange 14E extending radially outwardly along the lower surface 14D of the securing ring 14. The radial width of each groove 14F is the same as or slightly wider than the radial width of each of the locking members 18 of the base ring 12. The axial thickness of each groove 14F is the same as, or slightly greater than the axial thickness of each of the locking members 18 of the base ring 12. In this manner, when the securing ring 14 is assembled with the base ring 12 as hereinafter described, each of the locking members 18 of the base ring 12 is effectively captured within one of the grooves 14F of the securing ring 14 as shown in FIG. 3a to thereby prevent relative axial movement therebetween. Preferably, the arcuate length of each of the flanges 14E and therefore, the arcuate length of each of the grooves 14F of the securing ring 14 generally corresponds to or is greater than the arcuate length of each of the locking members 18.

In the illustrated embodiment, the securing ring 14 includes six generally identical, equally spaced grooves 14F with the arcuate spacing between adjacent grooves being greater than the arcuate length of each of the grooves 14F. It will be appreciated by those of ordinary skill in the art that the location and number of grooves 14F, the arcuate length, radial width and axial thickness of the grooves 14F, as well as the spacing between adjacent grooves 14F may vary in different applications. It will also appreciated by those of ordinary skill in the art that a mechanical structure, other than one or more grooves 14F may alternatively be employed for cooperating with the locking members 18 or some other structure of the base ring 12 for attaching the securing ring 14 to the base ring 12 when the two rings 12, 14 are assembled together as shown in FIG. 1. Accordingly, the foregoing description of the locking members 18 and the grooves 14F is provided only for purposes of illustrating a preferred, but not the only, way to interconnect the base ring 12 and the securing ring 14 in accordance with the present invention.

It will be appreciated by those of ordinary skill in the art that the size and/or shape of the securing ring 14 may vary from what has been shown and described. For example, the securing ring 14 could be thicker or more elongated for a particular application. Thus, the present invention should not be considered to be limited to a securing ring having the above-described characteristics.

The securing ring 14 includes at least one, but preferably, a plurality of workpiece engaging members 26 for engaging and holding a semiconductor wafer or other workpiece (not shown) against an underlying supporting surface (not shown). In the present embodiment, the engaging members 26 are generally circumferentially spaced and extend radially inwardly from the inner surface 14A of the securing ring 14. In the present embodiment, there are twelve such engaging members 26 with each of the engaging members 26 being generally equally spaced from each adjacent engaging member 26 around the circumference of the securing ring 14. As best shown in FIGS. 1, 2 and 3a, each engaging member 26 is generally triangular shaped in plan view with a tapered or beveled upper surface and a generally flat lower surface.

Once the base ring 12 has been secured to the supporting surface, the securing ring 14 is assembled to the base ring 12 by first supporting the securing ring 14 above the base ring 12 as shown in FIG. 2 with the locking members 18 of the base ring 12 generally aligned with the arcuate spaced portions of the securing ring 14 located between adjacent grooves 14F. The securing ring 14 is then lowered onto the base ring 12 and is then rotated with respect to the base ring 12, in either direction, so that the locking members 18 of the base ring 12 are contained within the grooves 14F of the securing ring as shown in FIG. 3a. Removal of the securing ring 14 from the base ring 12 is accomplished by reversing the foregoing steps.

As best shown in FIGS. 1 and 2, the base ring 12 includes a first generally rectangular keyway 20 formed by a groove extending into the upper surface 12C of the base ring 12. A second generally triangular keyway 24 is provided in the form of a groove on the upper surface 14C of the securing ring 14. The first and second keyways 20, 24 may be aligned with each other when the securing ring 14 is assembled with the base ring 12. A separate key 22 is provided for being installed into the first and second keyways 20, 24 to effectively lock together the securing ring 14 and the base ring 12 by preventing rotational movement of the securing ring 14 with respect to the base ring 12. The key 22 includes a generally circular opening 22A extending completely therethrough. A similar opening 20A is provided in the first keyway 20 so that when the key 22 is positioned within the first and second keyways 20, 24 as shown in FIG. 1, the key opening 22A is in registry with the keyway opening 20A so that a screw, bolt or other fastener may be installed within the openings to effectively lock the key 22 in place within the two keyways 20, 24. It will be appreciated by those of ordinary skill in the art that while in the present embodiment, two keyways 20, 24 are provided on the base ring 12 and clamping ring 14 and a suitably sized and shaped key 22 is provided for locking together the two rings 12, 14, the rings may be secured together in some other manner utilizing some other structure. For example, a small opening may extend through one or more of the grooves 14F and one or more locking members 18 for receiving a pin, screw or other fastener device for locking together the clamping ring 14 and the base ring 12.

Preferably, both the base ring 12 and the securing ring 14 are made of the same material. Materials which are typical for use in making such a clamp ring assembly 10, includes polyamide, ceramic, polyetheretherkeytone, polyetherimide and polybenzimidazole. However, it will be appreciated by those of ordinary skill in the art that other materials including other polymeric materials, certain metals or the like may alternatively be employed for making either or both of the rings. It will also be appreciated that while in the preferred embodiment, both rings 12, 14 are made of the same material, the rings 12, 14 could be made of different materials, if desired. Preferably, the key 22 is also made of the same material as the rings 12, 14, but could be made of some other suitable material.

The two-piece clamp ring assembly 10 was developed to provide a simple, cost effective method to address the problem of ring replacement once material erosion has occurred to a point that negatively impacts the performance of a one-piece clamp ring. With the one-piece clamp ring, the entire ring had to be replaced, resulting in a waste of a substantial amount of material, as well as a substantial time loss to remove all of the fasteners holding down the one-piece ring. With the present invention, only the securing ring 14 must be replaced do to wear. The securing ring 14 can be conveniently replaced by simply removing the fastener in the key 22 (if used), removing the key 22, and rotating the securing ring 14 with respect to the base ring 12 so that the locking members 18 of the base ring are aligned with the spacing between the grooves 14F of the securing ring. The securing ring 14 may then be lifted away from the base ring 12 and a new securing ring 14 can be installed following the steps discussed above. Replacing only the securing ring 14 reduces overall material consumption by up to 85%. The use of a single, easily removable key 22 to lock the securing ring 14 to the base ring 12 substantially reduces the time both for removal and replacement of the securing ring 14.

From the foregoing description, it can be seen that the present invention comprises a two-piece clamp ring assembly for holding a semiconductor wafer or other workpiece on a supporting surface. It will be appreciated by those of ordinary skill in the art that changes could be made to the embodiment described above, without departing from the broad inventive concepts thereof. It is understood, therefore, that this invention is not limited to the particular embodiment disclosed, but is intended to cover all modifications within the spirit and scope of the invention as set forth in the claims.

What is claimed is:

1. A clamp ring assembly for securing a generally circular workpiece to a supporting surface comprising:
   an annular base ring having a radial inner surface of a predetermined diameter and including at least one locking member, the base ring further including at least one opening extending axially therethrough for securing the base ring to the supporting surface; and
   an annular securing ring having a radial outer surface and a radial inner surface, the diameter of the outer surface being the same as, or slightly smaller than the diameter of the inner surface of the base ring, the securing ring including at least one locking member for engaging the locking member of the base ring when the securing ring is assembled with the base ring, the securing ring further including at least one workpiece engaging member for engaging and holding the workpiece against the supporting surface.

2. The clamp ring assembly as recited in claim 1, wherein the base ring locking member extends radially inwardly from the radial inner surface of the base ring and the securing ring locking member comprises a groove extending radially inwardly from the outer surface of the securing ring.

3. The clamp ring assembly as recited in claim 1, wherein the inner surface of the base ring includes a plurality of generally radially inwardly extending locking members and the outer surface of the securing ring includes a plurality of generally radially inwardly extending grooves, each of the grooves for receiving one of the locking members of the base ring when the securing ring is assembled with the base ring.

4. The clamp ring assembly as recited in claim 3, wherein the locking members are each of a first predetermined arcuate length and are generally equally circumferentially spaced from each other and the grooves are each of a second predetermined arcuate length and are generally equally circumferentially spaced from each other.

5. The clamp ring assembly as recited in claim 4 wherein the arcuate length of each of the locking members is smaller than the arcuate spacing between locking members and the arcuate spacing between the grooves.

6. The clamp ring assembly as recited in claim 1, further including a plurality of generally circumferentially spaced workpiece engaging members extending radially inwardly from the inner surface of the securing ring for engaging and holding the workpiece against the supporting surface.

7. The clamp ring assembly as recited in claim 1, further including a plurality of generally equally circumferentially spaced openings extending axially through the base ring for receiving a plurality of fasteners for securing the base ring to the supporting surface.

8. The clamp ring assembly as recited in claim 1 further including:
   a first keyway extending along a portion of the base ring;
   a second keyway extending along a portion of the securing ring; and
   a key, such that when the securing ring is assembled with the base ring with the first and second keyways aligned, the key is installed within the first and second keyways to prevent the securing ring from rotating with respect to the base ring.

9. The clamp ring assembly as recited in claim 8, wherein the key includes an opening and one of the first and second keyways includes an opening, such that when the securing ring is assembled with the base ring and the key is installed within the first and second keyways, the opening in the key is in registry with the keyway opening for receiving a fastener therein for securing the key within the first and second keyways.

10. A clamp ring assembly for securing a generally circular semiconductor wafer to a supporting surface comprising:
    an annular base ring having a radial inner surface of a predetermined diameter, the inner surface including a plurality of generally arcuate, radially inwardly extending circumferentially spaced locking members, the base ring further including a plurality of circumferentially spaced openings extending axially therethrough for receiving fasteners for securing the base ring to the supporting surface; and
    an annular securing ring having a radial outer surface and a radial inner surface, the diameter of the outer surface being the same as, or slightly smaller than the diameter of the inner surface of the base ring, the outer surface including a plurality of generally arcuate, radially inwardly extending grooves, so that when the securing ring is assembled with the base ring, each of the locking members is located within one of the grooves, the securing ring further including a plurality of generally circumferentially spaced engaging members extending radially inwardly from the inner surface thereof for engaging and holding the semiconductor wafer against the supporting surface.

11. The clamp ring assembly as recited in claim 10, wherein the arcuate length of each of the grooves generally corresponds to or is greater than the arcuate length of each of the locking members.

12. The clamp ring assembly as recited in claim 11 wherein the arcuate length of each of the locking members is smaller than the arcuate spacing between locking members and the arcuate spacing between the grooves.

13. The clamp ring assembly as recited in claim 10 wherein there are six generally, equally spacing locking members and six generally equally spaced grooves.

14. The clamp ring assembly as recited in claim 10, wherein there are twelve generally circumferentially spaced openings.

15. The clamp ring assembly as recited in claim 10, wherein there are twelve generally circumferentially spaced engaging members.

16. The clamp ring assembly as recited in claim 10, further including:
    a first keyway extending along a portion of the base ring;
    a second keyway extending along a portion of the securing ring; and
    a key, such that when the securing ring is assembled with the base ring with the first and second keyways aligned, the key is installed within the first and second keyways to prevent the securing ring from rotating with respect to the base ring.

17. The clamp ring assembly as recited in claim 16, wherein the first keyway is a groove provided on a circumferentially extending surface of the base ring and the second keyway is a groove provided on a circumferentially extending surface of the securing ring.

18. The clamp ring assembly as recited in claim 16, wherein the key includes an opening and one of the first and second keyways includes an opening such that when the securing ring is assembled with the base ring and the key is installed within the first and second keyways, the opening in the key is in registry with the keyway opening for receiving a fastener therein for securing the key within the first and second keyways.

* * * * *